US012684867B2

(12) United States Patent
     Cheng

(10) Patent No.: US 12,684,867 B2
(45) Date of Patent: Jul. 14, 2026

(54) COMPOSITE SUBSTRATE AND METHOD FOR MANUFACTURING THE SAME, AND SEMICONDUCTOR DEVICE STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 509 days.

(21) Appl. No.: 18/306,129

(22) Filed: Apr. 24, 2023

(65) Prior Publication Data

US 2024/0258321 A1 Aug. 1, 2024

(30) Foreign Application Priority Data

Jan. 30, 2023 (CN) .......................... 202310071004.8

(51) Int. Cl.
    *H10D 86/00* (2025.01)
    *H10D 86/01* (2026.01)
    *H10P 14/20* (2026.01)
    *H10P 14/60* (2026.01)

(52) U.S. Cl.
    CPC .......... *H10D 86/201* (2025.01); *H10D 86/01* (2025.01); *H10P 14/3211* (2026.01); *H10P 14/6306* (2026.01); *H10P 14/6349* (2026.01); *H10P 14/6506* (2026.01)

(58) Field of Classification Search
    CPC .................. H10D 86/201; H10D 86/01; H01L 21/02233; H01L 21/02293; H01L 21/02304; H01L 21/0245
    See application file for complete search history.

(56) References Cited

U.S. PATENT DOCUMENTS

| | | | | | |
|---|---|---|---|---|---|
| 5,461,243 | A | * | 10/1995 | Ek | H01L 21/0245 |
| | | | | | 257/190 |
| 2012/0241918 | A1 | * | 9/2012 | Boulet | H10F 71/1276 |
| | | | | | 257/E29.024 |
| 2015/0311382 | A1 | * | 10/2015 | Kim | H10H 20/8215 |
| | | | | | 257/94 |
| 2019/0157394 | A1 | * | 5/2019 | Xiang | H01L 21/0254 |
| 2021/0327709 | A1 | * | 10/2021 | Tanimura | H01L 21/02345 |

FOREIGN PATENT DOCUMENTS

CN 115528153 A * 12/2022 ......... H10H 20/8252

OTHER PUBLICATIONS

Machine translation of Cn 115528153A, 2025.*

* cited by examiner

*Primary Examiner* — Richard A Booth
(74) *Attorney, Agent, or Firm* — Westbridge IP LLC

(57) ABSTRACT

Disclosed are a composite substrate and a method for manufacturing the same, and a semiconductor device structure. In this application, after a buffer layer and an epitaxial growth layer are sequentially formed on a support substrate, the epitaxial growth layer is bonded on a target substrate of which a surface has a bonding layer, and the support substrate and the buffer layer are removed to form the composite substrate at least including the target substrate, the bonding layer and the epitaxial growth layer which are stacked sequentially, the buffer layer has a periodic structure in which a first sublayer and a second sublayer are alternately arranged. In this application, the buffer layer is provided with the periodic structure, so that a stress may be adjusted, and crystal quality of the epitaxial growth layer may be significantly improved.

17 Claims, 5 Drawing Sheets

| Providing a support substrate | — S1 |

↓

| Forming a buffer layer on the support substrate | — S2 |

↓

| Forming an epitaxial growth layer on the buffer layer | — S3 |

↓

| Bonding the epitaxial growth layer on a target substrate of which a surface has a bonding layer | — S4 |

↓

| Removing the support substrate and the buffer layer to form the composite substrate at least including the target substrate, the bonding layer and the epitaxial growth layer which are stacked sequentially | — S5 |

FIG. 1

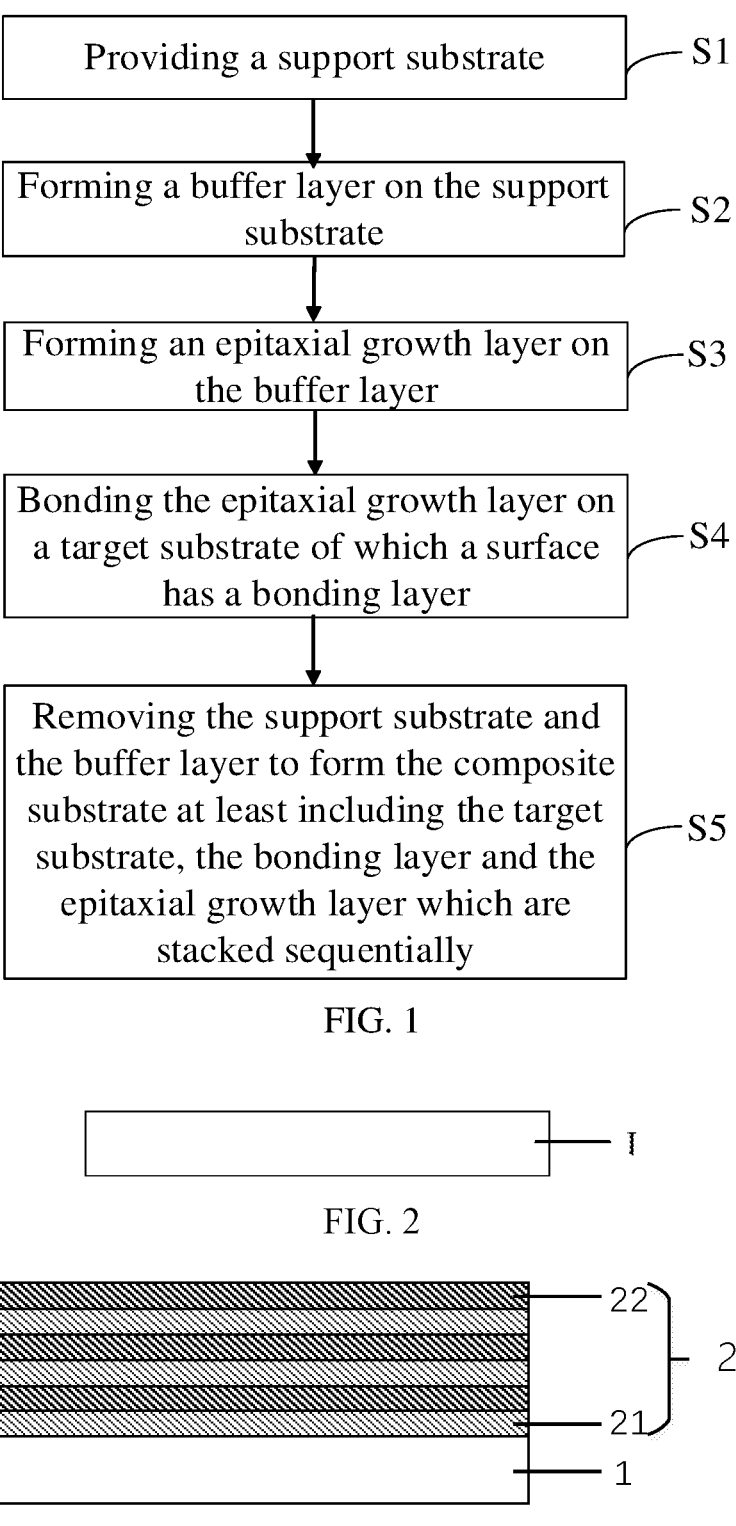

Polishing

Etching

Performing a thermal oxidation on a surface of the epitaxial growth layer, and manufacturing a first oxide layer on the surface of the epitaxial growth layer — S31

Manufacturing an intermediate layer on a surface of the first oxide layer — S32

Manufacturing a second oxide layer on a surface of the intermediate layer — S33

COMPOSITE SUBSTRATE AND METHOD FOR MANUFACTURING THE SAME, AND SEMICONDUCTOR DEVICE STRUCTURE

CROSS-REFERENCE TO RELATED APPLICATIONS

This application claims priority to Chinese Patent Application No. 202310071004.8, filed on Jan. 30, 2023, which is incorporated herein by reference in its entirety.

TECHNICAL FIELD

The present application relates to the field of semiconductor technologies, and in particular, to a composite substrate and a method for manufacturing the same, and a semiconductor device structure.

BACKGROUND

A Fully Depleted Silicon-On-Insulator (FD-SOI) technology currently on the market, also called an Extremely Thin Silicon-On-Insulator (ETSOI), has very strong competitiveness, which is one of the most popular technologies for a next-generation transistor structure. In a manufacturing process of IC, the SOI is manufactured based on a silicon substrate structure of silicon-insulating layer-silicon, which has advantages of reducing a parasitic capacitance of a device and improving performance of the device.

SUMMARY

The present application provides a composite substrate and a method for manufacturing the same, and a semiconductor device structure to solve the technical problems that in a FD-SOI structure, it is difficult to manufacture a silicon layer located at a top layer and having a thin thickness and a good crystal quality.

According to a first aspect of the present application, embodiments of the present application provide a method for manufacturing a composite substrate, including: S1: providing a support substrate; S2: forming a buffer layer on the support substrate; S3: forming an epitaxial growth layer on the buffer layer; S4: bonding the epitaxial growth layer on a target substrate of which a surface has a bonding layer; and S5: removing the support substrate and the buffer layer to form the composite substrate at least including the target substrate, the bonding layer and the epitaxial growth layer which are stacked sequentially, and the buffer layer has a periodic structure in which a first sublayer and a second sublayer are alternately arranged.

As an optional embodiment, a thickness of the first sublayer and a thickness of the second sublayer are constant; or a thickness of the first sublayer is constant, and a thickness of the second sublayer is variable; or a thickness of the first sublayer is variable, and a thickness of the second sublayer is constant.

As an optional embodiment, thicknesses of the first sublayer and the second sublayer range from 1 nm to 10 nm.

As an optional embodiment, a material of the first sublayer is SiGe, and a material of the second sublayer is at least one of Si and Ge.

As an optional embodiment, the periodic structure includes at least one period, each period includes one first sublayer and one second sublayer, and the number of the at least one period ranges from 2 to 20.

As an optional embodiment, a material of the epitaxial growth layer is at least one of Si, Ge and SiGe.

As an optional embodiment, the epitaxial growth layer has a resistivity of at least 100 Ohm·cm.

As an optional embodiment, the epitaxial growth layer includes a first conductivity type layer, and the first conductivity type layer is a p-type doped layer or an n-type doped layer.

As an optional embodiment, the forming an epitaxial growth layer includes: forming, by using an ion implantation, a first conductivity type region and a second conductivity type region in the epitaxial growth layer, the first conductivity type region and the second conductivity type region are alternately disposed in a horizontal direction, and a conductivity type of the first conductivity type region is opposite to that of the second conductivity type region.

As an optional embodiment, a thickness of the epitaxial growth layer ranges from 2 nm to 20 nm.

As an optional embodiment, the support substrate and the target substrate are silicon substrates.

As an optional embodiment, a material of the bonding layer is at least one of $SiO_2$, $Al_2O_3$, AlN, SiC, SiN, SiON, Polycrystalline Silicon and Amorphous Silicon.

As an optional embodiment, the method for manufacturing the composite substrate further includes: disposing a first buried layer between the bonding layer and the target substrate, a material of the first buried layer is at least one of $SiO_2$, $Al_2O_3$, AlN, SiC, SiN, SiON, Polycrystalline Silicon and Amorphous Silicon, and the material of the first buried layer is different from that of the bonding layer.

As an optional embodiment, the method for manufacturing the composite substrate further includes: disposing a first buried layer between the bonding layer and the target substrate, and disposing a second buried layer between the first buried layer and the target substrate, and a material of the second buried layer is at least one of $SiO_2$, $Al_2O_3$, AlN, SiC, SiN, SiON, Polycrystalline Silicon and Amorphous Silicon, and materials of the second buried layer, the bonding layer and the first buried layer are different.

As an optional embodiment, after the step S3, the method for manufacturing the composite substrate further includes: S31: performing a thermal oxidation on a surface of the epitaxial growth layer, and manufacturing a first oxide layer on the surface of the epitaxial growth layer.

As an optional embodiment, after the step S3, the method for manufacturing the composite substrate further includes: S31: performing a thermal oxidation on a surface of the epitaxial growth layer, and manufacturing a first oxide layer on the surface of the epitaxial growth layer; S32: manufacturing an intermediate layer on a surface of the first oxide layer, the intermediate layer including at least one layer of an amorphous silicon layer, a polycrystalline silicon layer, an amorphous silicon germanium layer, a polycrystalline silicon germanium layer, an amorphous silicon carbide layer, a polycrystalline silicon carbide layer, an amorphous aluminum nitride layer and a polycrystalline aluminum nitride layer; and S33: manufacturing a second oxide layer on a surface of the intermediate layer.

As an optional embodiment, the removing the buffer layer includes: removing the buffer layer by selective etching relative to the epitaxial growth layer.

As an optional embodiment, the removing the buffer layer by selective etching relative to the epitaxial growth layer includes: obtaining, according to a change situation of film structure information of the buffer layer, an etching depth of the selective etching relative to the epitaxial growth layer, the film structure information including at least one of thickness information, component information and period information; and selectively etching, according to the etching depth, the buffer layer to the epitaxial growth layer to remove the buffer layer.

According to a second aspect of the present application, embodiments of the present application provide a composite substrate, which is obtained by using the method for manufacturing the composite substrate in any of the above embodiments, and the composite substrate at least includes the target substrate, the bonding layer and the epitaxial growth layer which are stacked sequentially.

According to a third aspect of the present application, embodiments of the present application provide a semiconductor device structure, including: the composite substrate according to the above second aspect; a channel layer on the bonding layer of the composite substrate, the channel layer formed by patterning the epitaxial growth layer of the composite substrate; a gate insulating layer on a surface, away from the bonding layer, of the channel layer; a source electrode and a drain electrode on opposite sides of the channel layer; and a gate electrode on a surface, away from the channel layer, of the gate insulating layer.

BRIEF DESCRIPTION OF THE DRAWINGS

FIG. 1 is a schematic flowchart of a method for manufacturing a composite substrate according to an embodiment of the present application.

FIG. 2 to FIG. 5 are schematic structural diagrams illustrating the method for manufacturing the composite substrate according to an embodiment of the present application.

DETAILED DESCRIPTION OF THE EMBODIMENTS

Figure 4:
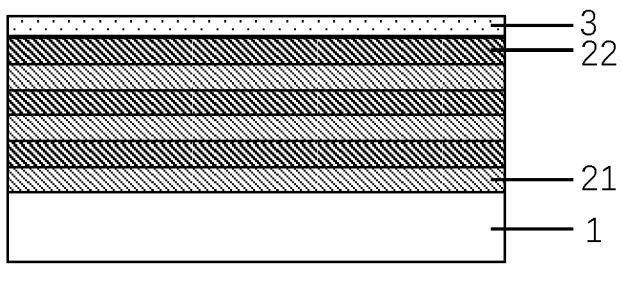

The technical solutions of the present application may be clearly and completely described with reference to the accompanying drawings in the embodiments of the present application. Obviously, the described embodiments are a part of the embodiments of the present application rather than all the embodiments. Based on the embodiments of the present application, all other embodiments obtained by those of ordinary skill in the art without creative work fall within the protection scope of this application.

In an FD-SOI structure, a thickness of a silicon layer located at a top layer in the SOI is thinned to 5 nm to 20 nm, so that a depletion layer below a channel position under a gate may fill an entire silicon layer when a device is working, eliminating a floating body effect common in Partially Depleted Silicon-On-Insulator (PD-SOI). However, it is difficult to manufacture, by an ordinary process, a silicon layer located at the top layer and having a thin thickness, a low defect density, a good crystal quality and hard to be cracked.

In order to solve the technical problems that in the FD-SOI structure, it is difficult to manufacture the silicon layer located at the top layer and having the thin thickness and the good crystal quality, the present application provides a composite substrate and a method for manufacturing the same, and a semiconductor device structure. In this application, after a buffer layer and an epitaxial growth layer are sequentially formed on a support substrate, the epitaxial growth layer is bonded on a target substrate of which a surface has a bonding layer, and the support substrate and the buffer layer are removed to form the composite substrate at least including the target substrate, the bonding layer and the epitaxial growth layer which are stacked sequentially. The buffer layer has a periodic structure in which a SiGe layer is arranged. In this application, the buffer layer is provided with the periodic structure, so that a stress may be adjusted, and a crystal quality of the epitaxial growth layer may be significantly improved. According to a method for transferring a substrate, the epitaxial growth layer with a thin thickness and a good crystal quality may be transferred to the bonding layer, and the composite substrate, having the epitaxial growth layer with an ultrathin thickness and a good crystal quality, may be finally manufactured.

A composite substrate and a method for manufacturing the same, and a semiconductor device structure mentioned in the present application are further illustrated in the following with reference to FIG. 1 to FIG. 13.

FIG. 1 is a schematic flowchart of a method for manufacturing a composite substrate according to an embodiment of the present application. FIG. 2 to FIG. 5 are schematic structural diagrams illustrating the method for manufacturing the composite substrate according to an embodiment of the present application. A structure obtained by each step in the method for manufacturing the composite substrate may be described in detail in combination with FIG. 2 to FIG. 5.

Step S1: as shown in FIG. 2, providing a support substrate 1. The support substrate 1 is a silicon substrate. Optionally, the support substrate 1 is annealed, and a crystal quality of the support substrate 1 is optimized by recrystallization.

Step S2: as shown in FIG. 3, forming a buffer layer 2 on the support substrate 1. The buffer layer 2 has a periodic structure in which a first sublayer 21 and a second sublayer 22 are alternately arranged.

In this embodiment, growth of the buffer layer 2 may be in situ growth, and the buffer layer 2 may also be manufactured by Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD), or a combination thereof.

In this embodiment, film structure information of the buffer layer 2 is recorded while the buffer layer 2 is formed. The film structure information includes at least one of thickness information, component information and period information. Alternatively, the buffer layer 2 is grown according to preset film structure information.

Specifically, the thickness information of the buffer layer 2 is that a thickness of the first sublayer 21 and a thickness of the second sublayer 22 are constant, and the thickness of the first sublayer 21 and the thickness of the second sublayer 22 is the same or different; or a thickness of the first sublayer 21 is constant, and a thickness of the second sublayer 22 is variable; or a thickness of the first sublayer 21 is variable, and a thickness of the second sublayer 22 is constant. The thicknesses of the first sublayer 21 and the second sublayer 22 range from 1 nm to 10 nm. Thickness variation of the first sublayer 21 and the second sublayer 22 are designed, so that a stress distribution of the buffer layer 2 can be controlled, improving a crystal quality of an epitaxial growth layer 3 grown above the buffer layer 2.

The component information of the buffer layer 2 is that a material of the first sublayer 21 is SiGe, and a material of the second sublayer 22 is at least one of Si and Ge.

The period information of the buffer layer 2 is that the periodic structure of the buffer layer 2 includes at least one period, each period includes one first sublayer 21 and one second sublayer 22, and the number of periods of the buffer layer 2 ranges from 2 to 20. Optionally, the number of periods of the buffer layer 2 ranges from 3 to 10. The buffer layer 2 is provided with multiple periods, so that a stress between the buffer layer 2 and the support substrate 1 may be released, and a crystal quality of the buffer layer 2 can be improved, improving the crystal quality of the epitaxial growth layer 3 grown above the buffer layer 2.

Step S3: as shown in FIG. 4, forming an epitaxial growth layer 3 on the buffer layer 2. A material of the epitaxial growth layer 3 is at least one of Si, Ge and SiGe.

Optionally, when the material of the epitaxial growth layer 3 is Si, and a material of a layer, farthest from the support substrate 1, in the periodic structure of the buffer layer 2 may be designed as Si; when the material of the epitaxial growth layer 3 is Ge, and the material of the layer, farthest from the support substrate 1, in the periodic structure of the buffer layer 2 may be designed as Ge; when the material of the epitaxial growth layer 3 is SiGe, and the material of the layer, farthest from the support substrate 1, in the periodic structure of the buffer layer 2 may be designed as SiGe. The buffer layer 2 is provided with the periodic structure, so that the stress may be adjusted, and a crystal quality of the layer, farthest from the support substrate 1, in the buffer layer 2 can be significantly improved. Therefore, when the epitaxial growth layer 3 with the same material as this layer is grown, lattice is matched and no cracks occur, so that the epitaxial growth layer 3 with the thin thickness and the good crystal quality may be manufactured. The thickness of the epitaxial growth layer 3 ranges from 2 nm to 20 nm, which may eliminate the floating body effect common in the PD-SOI.

Figure 5:
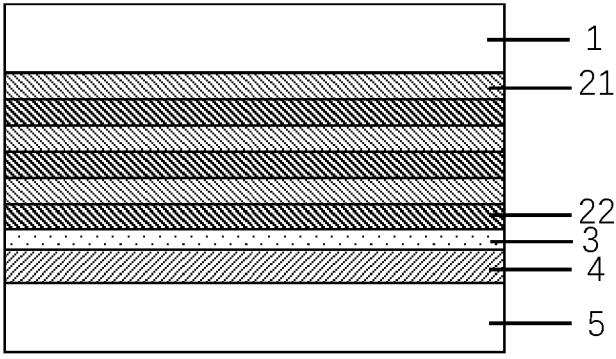

Step S4: as shown in FIG. 5, bonding the epitaxial growth layer 3 on a target substrate 5 of which a surface has a bonding layer 4. A material of the bonding layer 4 is at least one of $SiO_2$, $Al_2O_3$, AlN, SiC, SiN, SiON, Polycrystalline Silicon and Amorphous Silicon. The target substrate 5 is a silicon substrate. According to the method for transferring the substrate, the epitaxial growth layer 3 with the thin thickness and the good crystal quality may be transferred to the bonding layer 4, and the composite substrate, having the epitaxial growth layer 3 with an ultrathin thickness and a good crystal quality, may be finally manufactured.

Step S5: removing the support substrate 1 and the buffer layer 2 to form the composite substrate at least including the target substrate 5, the bonding layer 4 and the epitaxial growth layer 3 which are stacked sequentially.

Figure 6:
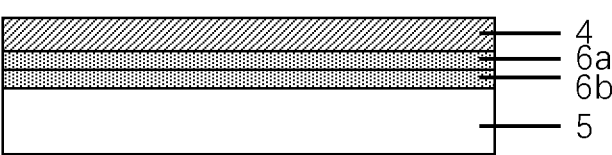
FIG. 6 is a schematic structural diagram of a structure obtained by intermediate steps in a method for manufacturing a composite substrate according to an embodiment of the present application.

FIG. 6 is a schematic structural diagram of a structure obtained by intermediate steps in a method for manufacturing a composite substrate according to an embodiment of the present application.

In an embodiment, as shown in FIG. 6, the method for manufacturing the composite substrate further includes: disposing a first buried layer 6a between the bonding layer 4 and the target substrate 5. A material of the first buried layer 6a is at least one of $SiO_2$, $Al_2O_3$, AlN, SiC, SiN, SiON, Polycrystalline Silicon and Amorphous Silicon, and the material of the first buried layer 6a is different from that of the bonding layer 4.

In another embodiment, as shown in FIG. 6, the method for manufacturing the composite substrate further includes: disposing a first buried layer 6a between the bonding layer 4 and the target substrate 5, and disposing a second buried layer 6b between the first buried layer 6a and the target substrate 5. A material of the second buried layer 6b is at least one of $SiO_2$, $Al_2O_3$, AlN, SiC, SiN, SiON, Polycrystalline Silicon and Amorphous Silicon, and materials of the second buried layer, the bonding layer and the first buried layer are different.

A thermal conductivity of the buried layer made of $SiO_2$ is low, and thermal expansion coefficients of Si and $SiO_2$ are significantly different. Films made of SiN, AlN, $Al_2O_3$ and other materials have higher the thermal conductivity than a $SiO_2$ insulating film on an ordinary SOI substrate, and stress matching may be adjusted by controlling film thicknesses of the first buried layer and the second buried layer. Therefore, the SOI substrate with multiple buried layers is better than the ordinary SOI substrate.

Figure 7:
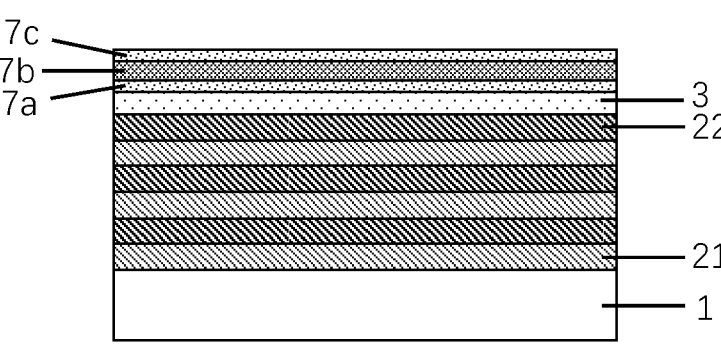
FIG. 7 is a schematic structural diagram of a structure obtained by intermediate steps in a method for manufacturing a composite substrate according to an embodiment of the present application.

FIG. 7 is a schematic structural diagram of a structure obtained by intermediate steps in a method for manufacturing a composite substrate according to an embodiment of the present application. FIG. 8c is a schematic flowchart of a method for manufacturing a composite substrate according to an embodiment of the present application.

In an embodiment, as shown in FIG. 7 and FIG. 8c, after the epitaxial growth layer 3 is formed, and before the epitaxial growth layer 3 is bonded on the target substrate 5 of which a surface has the bonding layer 4, the method for manufacturing the composite substrate also includes the following contents.

Step S31: performing a thermal oxidation on a surface of the epitaxial growth layer 3, and manufacturing a first oxide layer 7a on the surface of the epitaxial growth layer 3.

In another embodiment, as shown in FIG. 7, after the epitaxial growth layer 3 is formed, and before the epitaxial growth layer 3 is bonded on the target substrate 5 of which a surface has the bonding layer 4, the method for manufacturing the composite substrate also includes the following contents.

Step S31: performing a thermal oxidation on a surface of the epitaxial growth layer 3, and manufacturing a first oxide layer 7a on the surface of the epitaxial growth layer 3.

Step S32: manufacturing an intermediate layer 7b on a surface of the first oxide layer 7a. The intermediate layer 7b includes at least one layer of an amorphous silicon layer, a polycrystalline silicon layer, an amorphous silicon germanium layer, a polycrystalline silicon germanium layer, an amorphous silicon carbide layer, a polycrystalline silicon carbide layer, an amorphous aluminum nitride layer and a polycrystalline aluminum nitride layer.

Step S33: manufacturing a second oxide layer 7c on a surface of the intermediate layer 7b.

The manufacture of the oxide layer is beneficial to enhance an adhesion of the epitaxial growth layer 3 and the bonding layer 4 in a bonding process.

Optionally, when the material of the epitaxial growth layer 3 is Si, and materials of the first oxide layer 7a and the second oxide layer 7c may be designed as $SiO_2$; when the material of the epitaxial growth layer 3 is Ge, and materials of the first oxide layer 7a and the second oxide layer 7c may be designed as $GeO_2$; when the material of the epitaxial growth layer 3 is SiGe, and materials of the first oxide layer 7a and the second oxide layer 7c may be designed as $SiGeO_x$.

Figure 8A:
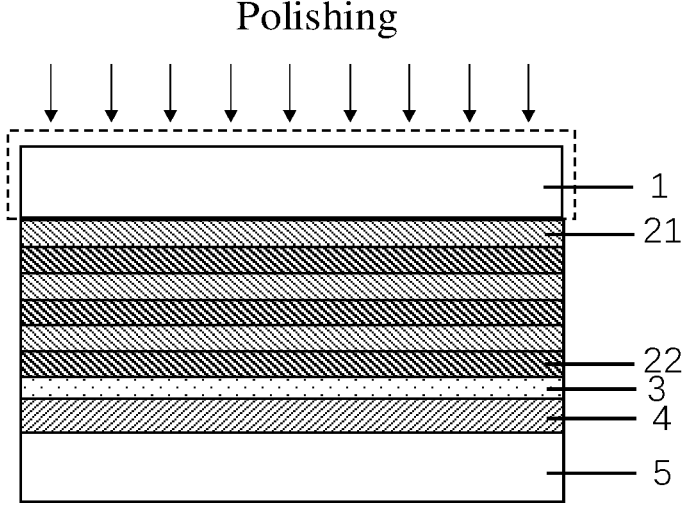
FIG. 8a and FIG. 8b are schematic process diagrams of step S5 in the method for manufacturing the composite substrate according to the embodiment in FIG. 1 to FIG. 5.
Figure 8B:
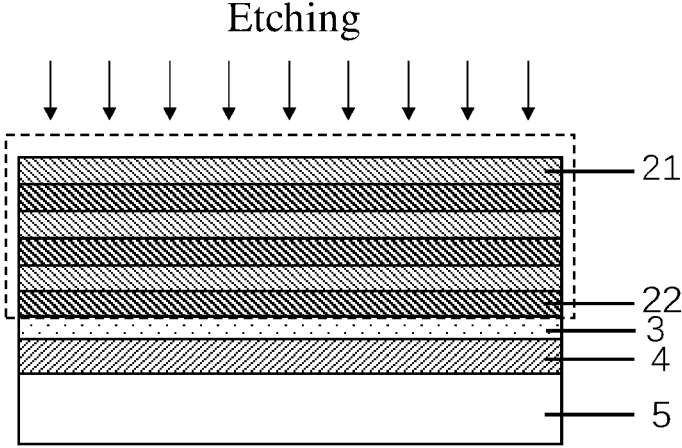
Figure 8C:
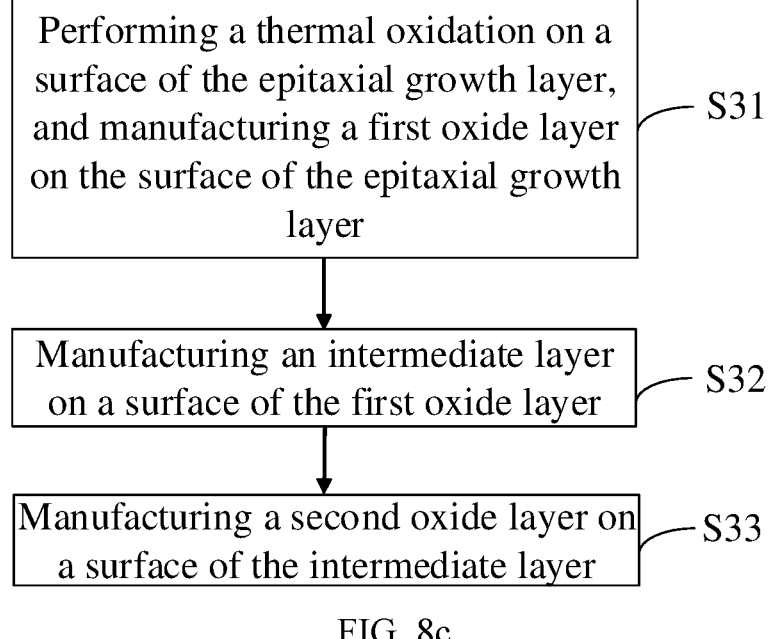
FIG. 8c is a schematic flowchart of a method for manufacturing a composite substrate according to an embodiment of the present application.
Figure 9:
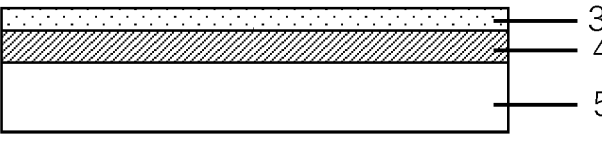
FIG. 9 is a schematic structural diagram of the composite substrate according to the embodiment in FIG. 1 to FIG. 5.

FIG. 8a and FIG. 8b are schematic process diagrams of step S5 in the method for manufacturing the composite substrate according to the embodiment in FIG. 1 to FIG. 5. FIG. 9 is a schematic structural diagram of the composite substrate according to the embodiment in FIG. 1 to FIG. 5. As shown in FIG. 8a and FIG. 8b, the support substrate 1 and the buffer layer 2 are removed to form the composite substrate at least including the target substrate 5, the bonding layer 4 and the epitaxial growth layer 3 which are stacked sequentially (shown in FIG. 9).

In this embodiment, the method for removing the supporting substrate 1 adopts polishing and Chemical Mechanical Polishing (CMP). First, the polishing is performed on the support substrate 1, to remove most of the support substrate 1 and remain the support substrate 1 with thickness of 5 μm to 10 μm. Subsequently, the CMP is performed on the remaining support substrate 1 with thickness of 5 μm to 10 μm to remain the support substrate 1 with thickness of 1 μm to 2 μm. The CMP is adopted, so that the support substrate 1 can be basically removed, and a flat surface without scratches and impurity contamination may be obtained.

In this embodiment, the method for removing the buffer layer 2 is etching, the buffer layer 2 may be provided with selective etching relative to the epitaxial growth layer 3, and the buffer layer 2 is etched to the epitaxial growth layer 3. During etching, at least one of the thickness information, the component information and the period information is monitored synchronously. The etching depth is obtained by comparing the film structure information when the buffer layer 2 is formed, and the buffer layer 2 is removed according to the etching depth.

Figure 10:
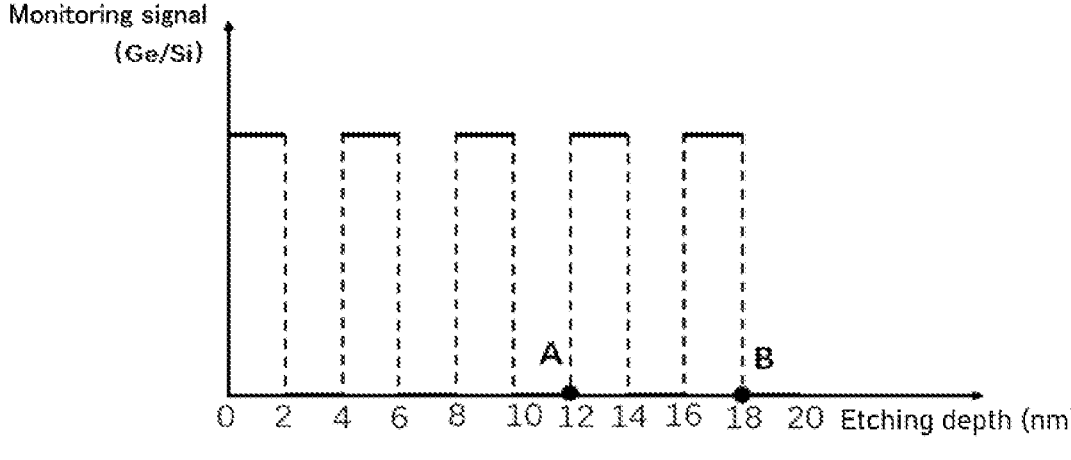
FIG. 10 is a schematic variational diagram of a monitoring signal (Ge/Si) with an etching depth.

Specifically, when the number of periods of the buffer layer 2 is determined, an etching situation of the buffer layer may be monitored by monitoring a change situation of components in the buffer layer during etching. FIG. 10 is a schematic variational diagram of a monitoring signal (Ge/Si) with an etching depth. For example, the number of periods of the buffer layer 2 is 5 and the thicknesses of the first sublayer 21 and the second sublayer 22 in the buffer layer 2 are both 2 nm.

When the material of the first sublayer 21 is SiGe, and material of the second sublayer 22 is Si, the etching depth is determined by monitoring the Ge signal of the first sublayer 21, so that the buffer layer 2 may be accurately etched to the epitaxial growth layer 3. The buffer layer 2 is etched, and composition of the Ge element is monitored in real-time during etching. Optionally, when the Ge signal generated in four periods of the buffer layer 2 is detected (for example, a position A in FIG. 10), it is necessary to consider that the action of stopping the etching is about to be performed, i.e., it is necessary to prepare in advance, to prevent over-etching; when the Ge signal generated in five periods of the buffer layer 2 is detected and the Ge signal just disappears (for example, a position B in FIG. 10), the etching is stopped. At this time, the buffer layer 2 has been etched to the epitaxial growth layer 3, and the composite substrate is obtained, shown in FIG. 9.

When the material of the first sublayer 21 is SiGe, and the material of the second sublayer 22 is Ge, the etching depth is determined by monitoring the Si signal of the first sublayer 21, so that the buffer layer 2 may be accurately etched to the epitaxial growth layer 3. The buffer layer 2 is etched, and composition of the Si element is monitored in real-time during etching. Optionally, when the Si signal generated in four periods of the buffer layer 2 is detected (for example, a position A in FIG. 10), it is necessary to consider that the action of stopping the etching is about to be performed, i.e., it is necessary to prepare in advance, to prevent over-etching; when the Si signal generated in five periods of the buffer layer 2 is detected and the Si signal just disappears (for example, a position B in FIG. 10), the etching is stopped. At this time, the buffer layer 2 has been etched to the epitaxial growth layer 3, and the composite substrate is obtained, shown in FIG. 9.

The buffer layer 2 is provided, not only the stress may be adjusted and the crystal quality of the epitaxial growth layer 3 may be significantly improved, but also the signal may be monitored and the etching depth may be controlled.

Figure 11:
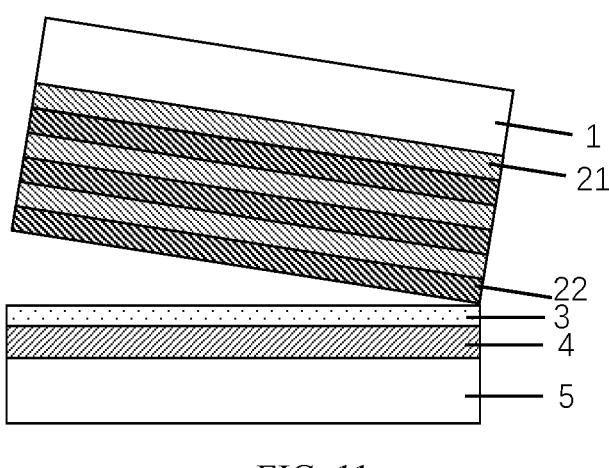
FIG. 11 is a schematic process diagram of overall stripping of the composite substrate according to the embodiment in FIG. 1 to FIG. 5.

In an embodiment, the method for removing the support substrate 1 and the buffer layer 2 may adopt overall stripping. FIG. 11 is a schematic process diagram of overall stripping of the composite substrate according to the embodiment in FIG. 1 to FIG. 5. As shown in FIG. 11, the layer, farthest from the support substrate 1, in the periodic structure of the buffer layer 2 is used as an etching sacrificial layer. From the etching sacrificial layer, the overall stripping is performed on the support substrate 1 and the buffer layer 2.

In an embodiment, after the support substrate 1 and the buffer layer 2 are removed, the method for manufacturing the composite substrate further includes: performing high temperature annealing on the epitaxial growth layer 3 exposed after the buffer layer 2 is etched, to repair surface damage caused by etching. The high temperature annealing may be laser annealing. Compared with traditional high temperature annealing, the laser annealing has the advantages of rapid temperature rise and local treatment of grooves. The laser annealing is performed by supplying gases used to grow the epitaxial growth layer 3, such as nitrogen, argon, or oxygen. The laser annealing of the epitaxial growth layer 3 may improve an internal structure of the epitaxial growth layer 3, to obtain the epitaxial growth layer 3 with the high crystal quality. Or, after the support substrate 1 and the buffer layer 2 are removed, the CMP is performed on the epitaxial growth layer 3, to obtain a flat surface of the epitaxial growth layer 3 without scratches and impurity contamination, and thickness uniformity of the composite substrate is improved.

Figure 12:
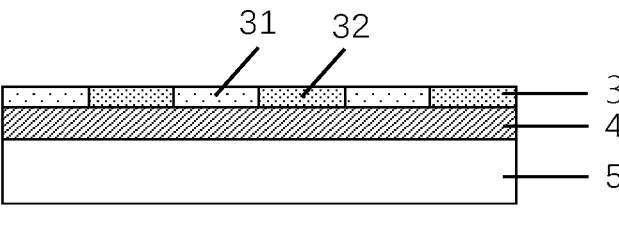
FIG. 12 is a schematic structural diagram of a composite substrate according to an embodiment of the present application.

FIG. 12 is a schematic structural diagram of a composite substrate according to an embodiment of the present application. The composite substrate at least includes the target substrate 5, the bonding layer 4 and the epitaxial growth layer 3 which are stacked sequentially. The epitaxial growth layer 3 has a resistivity of at least 100 Ohm·cm. The epitaxial growth layer 3 includes a first conductivity type layer, and the first conductivity type layer is a p-type doped layer or an n-type doped layer.

In an embodiment, the forming an epitaxial growth layer includes: forming, by using an ion implantation, a first conductivity type region 31 and a second conductivity type region 32 in the epitaxial growth layer 3. The first conductivity type region 31 and the second conductivity type region 32 are alternately disposed in a horizontal direction, and a conductivity type of the first conductivity type region 31 is opposite to that of the second conductivity type region 32. The first conductivity type region 31 and the second conductivity type region 32 are alternately disposed, so that the resistivity of the composite substrate is improved by taking advantage of a depletion isolation effect of PN junction, thereby manufacturing a semiconductor device with high frequency and low loss.

Figure 13:
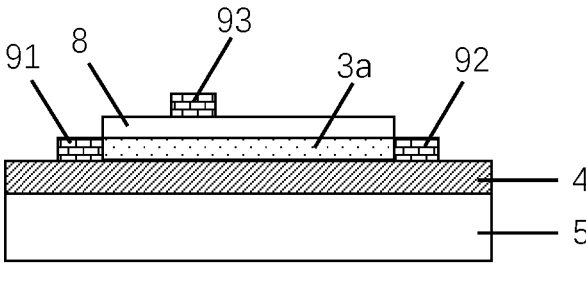
FIG. 13 is a schematic structural diagram of a semiconductor device structure according to an embodiment of the present application.

FIG. 13 is a schematic structural diagram of a semiconductor device structure according to an embodiment of the present application. As shown in FIG. 13, the semiconductor device structure includes the above composite substrate having a surface layer with the ultrathin thickness and the good crystal quality; a channel layer 3a on the bonding layer 4 of the composite substrate, the channel layer 3a formed by patterning the epitaxial growth layer 3 of the composite substrate; a gate insulating layer 8 on a surface, away from the bonding layer 4, of the channel layer 3a; a source electrode 91 and a drain electrode 92 on opposite sides of the channel layer 3a; and a gate electrode 93 on a surface, away from the channel layer 3a, of the gate insulating layer 8.

In this embodiment, the source electrode 91 is disposed on the epitaxial growth layer 3 of the composite substrate, disposed on one side of the channel layer 3a and forms an ohmic contact to the channel layer 3a; the drain electrode 92 is disposed on the epitaxial growth layer 3 of the composite substrate, disposed on the other side, away from the source electrode 91, of the channel layer 3a and forms an ohmic contact to the channel layer 3a; the gate electrode 93 is disposed on the gate insulating layer 8 and forms a Schottky contact to the gate insulating layer 8. The source electrode 91, the drain electrode 92 and the gate electrode 93 may be made of metal materials such as nickel alloy, metal oxide materials or semiconductor materials, which are not limited in the present application. A material of the gate insulating layer 8 is a dielectric material with high dielectric constant, which includes at least one of $HfO_2$, $Al_2O_3$ and $Si_3N_4$. The stronger the ability of the dielectric material with high dielectric constant to bind a charge, the more difficult it is to polarize the charge in an external electric field, and the less the polarization charge, the weaker the polarization electric field, thereby effectively avoiding a short channel effect of the semiconductor structure.

The present application provides a composite substrate and a method for manufacturing the same, and a semiconductor device structure. In this application, after the buffer layer and the epitaxial growth layer are sequentially formed on the support substrate, the epitaxial growth layer is bonded on the target substrate of which a surface has the bonding layer, and the support substrate and the buffer layer are removed to form the composite substrate at least including the target substrate, the bonding layer and the epitaxial growth layer which are stacked sequentially. The buffer layer has the periodic structure in which the first sublayer and the second sublayer are alternately arranged. In this application, the buffer layer is provided with the periodic structure, so that the stress may be adjusted, and the crystal quality of the epitaxial growth layer may be significantly improved. According to the method for transferring the substrate, the epitaxial growth layer with the thin thickness and the good crystal quality may be transferred to the bonding layer, and the composite substrate, having the epitaxial growth layer with an ultrathin thickness and a good crystal quality, may be finally manufactured.

It should be understood that in this specification, the term "include", and any other variant thereof are open including, i.e., "including but not limited to". The term "one embodiment" means "at least one embodiment"; the term "another embodiment" means "at least one other embodiment". In this specification, the schematic expression of the above terms need not be directed at the same embodiment or example. Furthermore, the specific features, structures, materials or characteristics described may be combined in an appropriate manner in any one or more embodiments or examples. In addition, without contradiction, those skilled in the art may combine and constitute different embodiments or examples described in this specification, and the features in different embodiments or examples.

The above are only preferred embodiments of the present application and are not intended to limit the protection scope of the present application. Any modification, equivalent replacement, improvement, etc. made within the spirit and principle of this application shall be included within the protection scope of this application.

What is claimed is:

1. A method for manufacturing a composite substrate, comprising:

S1: providing a support substrate;

S2: forming a buffer layer on the support substrate;

S3: forming an epitaxial growth layer on the buffer layer;

S4: bonding the epitaxial growth layer on a target substrate of which a surface has a bonding layer; and S5: removing the support substrate and the buffer layer to form the composite substrate at least comprising the target substrate, the bonding layer and the epitaxial growth layer which are stacked sequentially, wherein the buffer layer has a periodic structure in which a first sublayer and a second sublayer are alternately arranged; and the method for manufacturing the composite substrate further comprises:

disposing a first buried layer between the bonding layer and the target substrate, wherein a material of the first buried layer is at least one of $SiO_2$, $Al_2O_3$, AlN, SiC, SiN, SiON, Polycrystalline Silicon and Amorphous Silicon, and the material of the first buried layer is different from that of the bonding layer.

2. The method for manufacturing a composite substrate according to claim 1, wherein a thickness of the first sublayer and a thickness of the second sublayer are constant; or a thickness of the first sublayer is constant, and a thickness of the second sublayer is variable; or a thickness of the first sublayer is variable, and a thickness of the second sublayer is constant.

3. The method for manufacturing a composite substrate according to claim 1, wherein thicknesses of the first sublayer and the second sublayer range from 1 nm to 10 nm.

4. The method for manufacturing a composite substrate according to claim 1, wherein a material of the first sublayer is SiGe, and a material of the second sublayer is at least one of Si and Ge.

5. The method for manufacturing a composite substrate according to claim 1, wherein the periodic structure comprises at least one period, each period comprises one first sublayer and one second sublayer, and the number of the at least one period ranges from 2 to 20.

6. The method for manufacturing a composite substrate according to claim 1, wherein a material of the epitaxial growth layer is at least one of Si, Ge and SiGe.

7. The method for manufacturing a composite substrate according to claim 1, wherein the epitaxial growth layer has a resistivity of at least 100 Ohm·cm.

8. The method for manufacturing a composite substrate according to claim 1, wherein the epitaxial growth layer comprises a first conductivity type layer, and the first conductivity type layer is a p-type doped layer or an n-type doped layer.

9. The method for manufacturing a composite substrate according to claim 1, wherein the forming an epitaxial growth layer comprises:

forming, by using an ion implantation, a first conductivity type region and a second conductivity type region in the epitaxial growth layer, wherein the first conductivity type region and the second conductivity type region are alternately disposed in a horizontal direction, and a conductivity type of the first conductivity type region is opposite to that of the second conductivity type region.

10. The method for manufacturing a composite substrate according to claim 1, wherein a thickness of the epitaxial growth layer ranges from 2 nm to 20 nm.

11. The method for manufacturing a composite substrate according to claim 1, wherein the support substrate and the target substrate are silicon substrates.

12. The method for manufacturing a composite substrate according to claim 1, wherein a material of the bonding layer is at least one of $SiO_2$, $Al_2O_3$, AlN, SiC, SiN, SiON, Polycrystalline Silicon and Amorphous Silicon.

13. The method for manufacturing a composite substrate according to claim 1, further comprising:

disposing a first buried layer between the bonding layer and the target substrate, and disposing a second buried layer between the first buried layer and the target substrate, wherein a material of the second buried layer is at least one of $SiO_2$, $Al_2O_3$, AlN, SiC, SiN, SiON, Polycrystalline Silicon and Amorphous Silicon, and materials of the second buried layer, the bonding layer and the first buried layer are different.

14. The method for manufacturing a composite substrate according to claim 1, wherein after the step S3, the method further comprises:

S31: performing a thermal oxidation on a surface of the epitaxial growth layer, and manufacturing a first oxide layer on the surface of the epitaxial growth layer.

15. The method for manufacturing a composite substrate according to claim 1, wherein after the step S3, the method further comprises:

S31: performing a thermal oxidation on a surface of the epitaxial growth layer, and manufacturing a first oxide layer on the surface of the epitaxial growth layer;

S32: manufacturing an intermediate layer on a surface of the first oxide layer, the intermediate layer comprising at least one layer of an amorphous silicon layer, a polycrystalline silicon layer, an amorphous silicon germanium layer, a polycrystalline silicon germanium layer, an amorphous silicon carbide layer, a polycrystalline silicon carbide layer, an amorphous aluminum nitride layer and a polycrystalline aluminum nitride layer; and S33: manufacturing a second oxide layer on a surface of the intermediate layer.

16. The method for manufacturing a composite substrate according to claim 1, wherein the removing the buffer layer comprises:

removing the buffer layer by selective etching relative to the epitaxial growth layer.

17. The method for manufacturing a composite substrate according to claim 16, wherein the removing the buffer layer by selective etching relative to the epitaxial growth layer comprises:

obtaining, according to a change situation of film structure information of the buffer layer, an etching depth of the selective etching relative to the epitaxial growth layer, the film structure information comprising at least one of thickness information, component information and period information; and selectively etching, according to the etching depth, the buffer layer to the epitaxial growth layer to remove the buffer layer.

\* \* \* \* \*